US 11,869,921 B2

(12) United States Patent
Yang et al.

(10) Patent No.: US 11,869,921 B2
(45) Date of Patent: Jan. 9, 2024

(54) LIGHT EMITTING PLATE, WIRING PLATE AND DISPLAY DEVICE

(71) Applicant: BOE TECHNOLOGY GROUP CO., LTD., Beijing (CN)

(72) Inventors: Ming Yang, Beijing (CN); Wei Hao, Beijing (CN); Qibing Gu, Beijing (CN); Guofeng Hu, Beijing (CN); Lingyun Shi, Beijing (CN); Minghua Xuan, Beijing (CN); Can Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 369 days.

(21) Appl. No.: 17/281,443

(22) PCT Filed: Jan. 21, 2020

(86) PCT No.: PCT/CN2020/073558
§ 371 (c)(1),
(2) Date: Mar. 30, 2021

(87) PCT Pub. No.: WO2021/146931
PCT Pub. Date: Jul. 29, 2021

(65) Prior Publication Data
US 2022/0123044 A1    Apr. 21, 2022

(51) Int. Cl.
*H01L 27/15* (2006.01)
*H01L 33/38* (2010.01)
*H01L 33/62* (2010.01)

(52) U.S. Cl.
CPC .......... *H01L 27/156* (2013.01); *H01L 33/387* (2013.01); *H01L 33/62* (2013.01)

(58) Field of Classification Search
CPC ..... H01L 27/156; H01L 33/387; H01L 33/62; H01L 25/0753; H10K 59/00
See application file for complete search history.

(56) References Cited

U.S. PATENT DOCUMENTS 10,008,635 B2    6/2018    Jeon et al.
10,763,302 B2    9/2020    Liao et al.
(Continued)

FOREIGN PATENT DOCUMENTS

CN    102822884 A    12/2012
CN    106663734 A     5/2017
(Continued)

OTHER PUBLICATIONS

Written Opinion of the International Searching Authority of PCT/CN2020/073558, dated Oct. 16, 2020 in English.
(Continued)

*Primary Examiner* — David Vu
(74) *Attorney, Agent, or Firm* — Collard & Roe, P.C.; William Collard (57) ABSTRACT

A light emitting plate, a wiring plate and a display device are provided. The light emitting plate includes a base substrate; and light emitting units on the base substrate. Each of the light emitting units includes a light emitting sub-unit, the light emitting sub-unit includes a connection line unit and a light emitting diode chip connected with the connection line unit. The connection line unit includes at least two electrical contact pairs, and each of the at least two electrical contact pairs includes a first electrode contact and a second electrode contact; in each connection line unit, the second electrode contacts are electrically connected with each other, the first electrode contacts are electrically connected with each other, and only one of the at least two electrical contact pairs in each connection line unit is connected with the light emitting diode chip.

18 Claims, 5 Drawing Sheets

(56) References Cited

U.S. PATENT DOCUMENTS

| | | |
|---|---|---|
| 10,867,971 B2 | 12/2020 | Liu et al. |
| 2013/0001546 A1 | 1/2013 | Kamada et al. |
| 2015/0371585 A1 | 12/2015 | Bowe et al. |
| 2017/0187976 A1 | 6/2017 | Cok |
| 2018/0373366 A1* | 12/2018 | Li .................. G06F 3/0443 |
| 2020/0111941 A1 | 4/2020 | Xing et al. |
| 2020/0194406 A1 | 6/2020 | Liu et al. |

FOREIGN PATENT DOCUMENTS

| | | |
|---|---|---|
| CN | 107657900 A | 2/2018 |
| CN | 208014703 U | 10/2018 |
| CN | 209015627 U | 6/2019 |
| CN | 110190176 A | 8/2019 |
| CN | 110211987 A | 9/2019 |
| TW | M573054 U | 1/2019 |
| TW | 201923728 A | 6/2019 |
| TW | I668856 B | 8/2019 |

OTHER PUBLICATIONS

International Search Report of PCT/CN2020/073558 in Chinese, dated Oct. 16, 2020 with English translation.
Notice of Transmittal of the International Search Report of PCT/CN2020/073558 in Chinese, dated Oct. 16, 2020.
Written Opinion of the International Searching Authority of PCT/CN2020/073558 in Chinese, dated Oct. 16, 2020.
Taiwan Office Action in Taiwanese Application No. 109146206 dated Aug. 10, 2021.
Extended European Search Report in European Application No. 20866971.3 dated Sep. 29, 2023.

* cited by examiner

LIGHT EMITTING PLATE, WIRING PLATE AND DISPLAY DEVICE

CROSS REFERENCE TO RELATED APPLICATIONS

This application is the National Stage of PCT/CN2020/073558 filed on Jan. 21, 2020, the disclosure of which is incorporated by reference.

TECHNICAL FIELD

At least one embodiments of the present disclosure relates to a light emitting plate, a wiring plate and a display device.

BACKGROUND

At present, with the continuous progress of display technology, users' requirements for brightness, contrast and other performance of products are also increasing. On the one hand, mini light emitting diode (Mini LED) can be used as a backlight source. When Mini LED is combined with traditional liquid crystal display panel as a backlight source, by controlling the switch of Mini LED in the partition, a liquid crystal display device can have high contrast comparable to an organic light emitting diode display device. On the other hand, Mini LED can also be directly made into large-size display products, which has a good market prospect.

SUMMARY

Embodiments of the present disclosure provide a light emitting plate, a wiring plate and a display device.

At least one embodiment of the disclosure provides a light emitting plate, comprising: a base substrate; and a plurality of light emitting units, arranged on the base substrate along a first direction and a second direction, each of the plurality of light emitting units comprising at least one light emitting sub-unit, the light emitting sub-unit comprising a connection line unit and a light emitting diode chip connected with the connection line unit, the light emitting diode chip being located at a side of the connection line unit away from the base substrate; wherein each connection line unit comprises at least two electrical contact pairs, and each of the at least two electrical contact pairs comprises a first electrode contact and a second electrode contact; in each connection line unit, the first electrode contacts are electrically connected with each other, the second electrode contacts are electrically connected with each other, and only one electrical contact pair of the at least two electrical contact pairs is connected with the light emitting diode chip.

For example, the light emitting plate further comprises: a plurality of first electrode wires extending along the first direction, wherein the plurality of first electrode wires comprises a plurality of first-type first electrode wires and a plurality of second-type first electrode wires, a column of light emitting sub-units arranged along the first direction comprises a plurality of first light emitting sub-units and a plurality of second light emitting sub-units, the plurality of first light emitting sub-units are connected with the first-type first electrode wire through the first electrode contacts, and the plurality of second light emitting sub-units are connected with the second-type first electrode wire through the first electrode contacts.

For example, the first-type first electrode wire and the second-type first electrode wire that are connected with a column of light emitting sub-units arranged along the first direction are located at both sides of the column of light emitting sub-units, respectively.

For example, each of the plurality of first-type first electrode wires comprises a first sub-electrode wire and a second sub-electrode wire which extend along a same straight line and are insulated from each other, a part of the plurality of first light emitting sub-units close to the first sub-electrode wire are connected with the first sub-electrode wire, and a part of the plurality of first light emitting sub-units close to the second sub-electrode wire are connected with the second sub-electrode wire; each of the plurality of second-type first electrode wires comprises a third sub-electrode wire and a fourth sub-electrode wire which extend along a same straight line and are insulated from each other, a part of the plurality of second light emitting sub-units close to the third sub-electrode wire are connected with the third sub-electrode wire, and a part of the plurality of second light emitting sub-units close to the fourth sub-electrode wire are connected with the fourth sub-electrode wire.

For example, the light emitting plate further comprises: a plurality of second electrode wires, extending along the second direction, the plurality of second electrode wires being located between the plurality of first electrode wires and the base substrate, wherein each connection line unit further comprises a second electrode connecting portion, the second electrode connecting portion is arranged in a same layer as the first electrode wire, and the second electrode contact in each connection line unit is connected with the second electrode wire through the second electrode connecting portion.

For example, the second electrode contact is integrated with the second electrode connecting portion.

For example, in the first direction, an orthographic projection of each second electrode wire on the base substrate is overlapped with an orthographic projection of one of the electrical contact pairs and a part of the second electrode connecting portion on the base substrate.

For example, each of the plurality of light emitting units comprises three light emitting sub-units of different colors arranged along the second direction, the second electrode wire comprises a first-type second electrode wire and a second-type second electrode wire, and one of the three light emitting sub-units in the each of the plurality of light emitting units is connected with the first-type second electrode wire, and the other two of the three light emitting sub-units in the each of the plurality of light emitting units are connected with the second-type second electrode wire.

For example, each connection line unit comprises two electrical contact pairs, and each connection line unit further comprises two first electrode connecting portions connected with the first electrode contacts, the first electrode connecting portion is located at a side of the first electrode contact away from the second electrode contact, the first electrode contact is connected with the first electrode wire through the first electrode connecting portion, and an orthographic projection of at least part of the first electrode connecting portion on the base substrate is not overlapped with an orthographic projection of the second electrode wire on the base substrate.

At least one embodiment of the disclosure provides a wiring plate, comprising: a base substrate; a plurality of connection line units, arranged on the base substrate along a first direction and a second direction, wherein each of the plurality of connection line units comprises at least two electrical contact pairs, and each of the at least two electrical contact pairs comprises a first electrode contact and a second electrode contact; in each connection line unit, the first electrode contacts are electrically connected with each other, and the second electrode contacts are electrically connected with each other.

For example, the wiring plate further comprises: a plurality of first electrode wires extending along the first direction, wherein the plurality of first electrode wires comprises a plurality of first-type first electrode wires and a plurality of second-type first electrode wires, a column of connection line units arranged along the first direction comprises a plurality of first connection line units and a plurality of second connection line units, the first electrode contacts of the plurality of first connection line units are connected with the plurality of first-type first electrode wires, and the first electrode contacts of the plurality of second connection line units are connected with the plurality of second-type first electrode wires.

For example, the first-type first electrode wire and the second-type first electrode wire that are connected with a column of connection line units arranged along the first direction are located at both sides of the column of the connection line units, respectively.

For example, each of the plurality of first-type first electrode wires comprises a first sub-electrode wire and a second sub-electrode wire which extend along a same straight line and are insulated from each other, a part of the plurality of first connection line units close to the first sub-electrode wire are connected with the first sub-electrode wire, and a part of the plurality of first connection line units close to the second sub-electrode wire are connected with the second sub-electrode wire; each of the plurality of second-type first electrode wires comprises a third sub-electrode wire and a fourth sub-electrode wire which extend along a same straight line and are insulated from each other, a part of the plurality of second connection line units close to the third sub-electrode wire are connected with the third sub-electrode wire, and a part of the plurality of second connection line units close to the fourth sub-electrode wire are connected with the fourth sub-electrode wire.

For example, the wiring plate further comprises: a plurality of second electrode wires, extending along the second direction, the plurality of second electrode wires being located at a side of the plurality of first electrode wires facing the base substrate, wherein each connection line unit further comprises a second electrode connecting portion, the second electrode connecting portion is arranged in a same layer as the first electrode wire, and the second electrode contact in each connection line unit is connected with the second electrode wire through the second electrode connecting portion.

For example, in the first direction, an orthographic projection of each second electrode wire on the base substrate is overlapped with an orthographic projection of one of the electrical contact pairs and a part of the second electrode connecting portion on the base substrate.

For example, three adjacent connection line units arranged along the second direction form a connection line unit group, the second electrode wire comprises a first-type second electrode wire and a second-type second electrode wire, one of the three connection line units in the connection line unit group is connected with the first-type second electrode wire, and the other two of the three connection line units in the connection line unit group are connected with the second-type second electrode wire.

For example, each of the plurality of connection line units comprises two electrical contact pairs, and each connection line unit further comprises two first electrode connecting portions connected with the first electrode contacts, the first electrode connecting portion is located at a side of the first electrode contact away from the second electrode contact, the first electrode contact is connected with the first electrode wire through the first electrode connecting portion, and an orthographic projection of at least part of the first electrode connecting portion on the base substrate is not overlapped with an orthographic projection of the second electrode wire on the base substrate.

One embodiment of the disclosure provides a display device, comprising the light emitting plate according to any items as mentioned above, The light emitting plate is a display panel.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

Embodiments of the present disclosure provide a light emitting plate, a wiring plate and a display device. The light emitting plate includes a base substrate and a plurality of light emitting units located on the base substrate. The plurality of light emitting units are arranged on the base substrate along a first direction and a second direction, each light emitting unit includes at least one light emitting sub-unit, the light emitting sub-unit includes a connection line unit and a light emitting diode chip connected with the connection line unit, and the light emitting diode chip is located at one side of the connection line unit away from the base substrate. Each connection line unit includes at least two electrical contact pairs, and each electrical contact pair includes a first electrode contact and a second electrode contact; in each connection line unit, the first electrode contacts are electrically connected with each other, the second electrode contacts are electrically connected with each other, and only one electrical contact pair of the at least two electrical contact pairs is connected with the light emitting diode chip. In the embodiment of the present disclosure, all the first electrode contacts in the at least two electrical contact pairs arranged in each connection line unit are electrically connected with each other, and all the second electrode contacts in the at least two electrical contact pairs arranged in each connection line unit are electrically connected with each other; in the case where the light emitting diode chip connected with one electrical contact pair of the connection line unit is defective, a backup light emitting diode chip can be connected with any one backup electrical contact pair, so as to repair the light emitting sub-unit.

The light emitting plate, the wiring plate and the display device provided by the embodiments of the present disclosure will be described below with reference to the accompanying drawings.

Figure 1A:
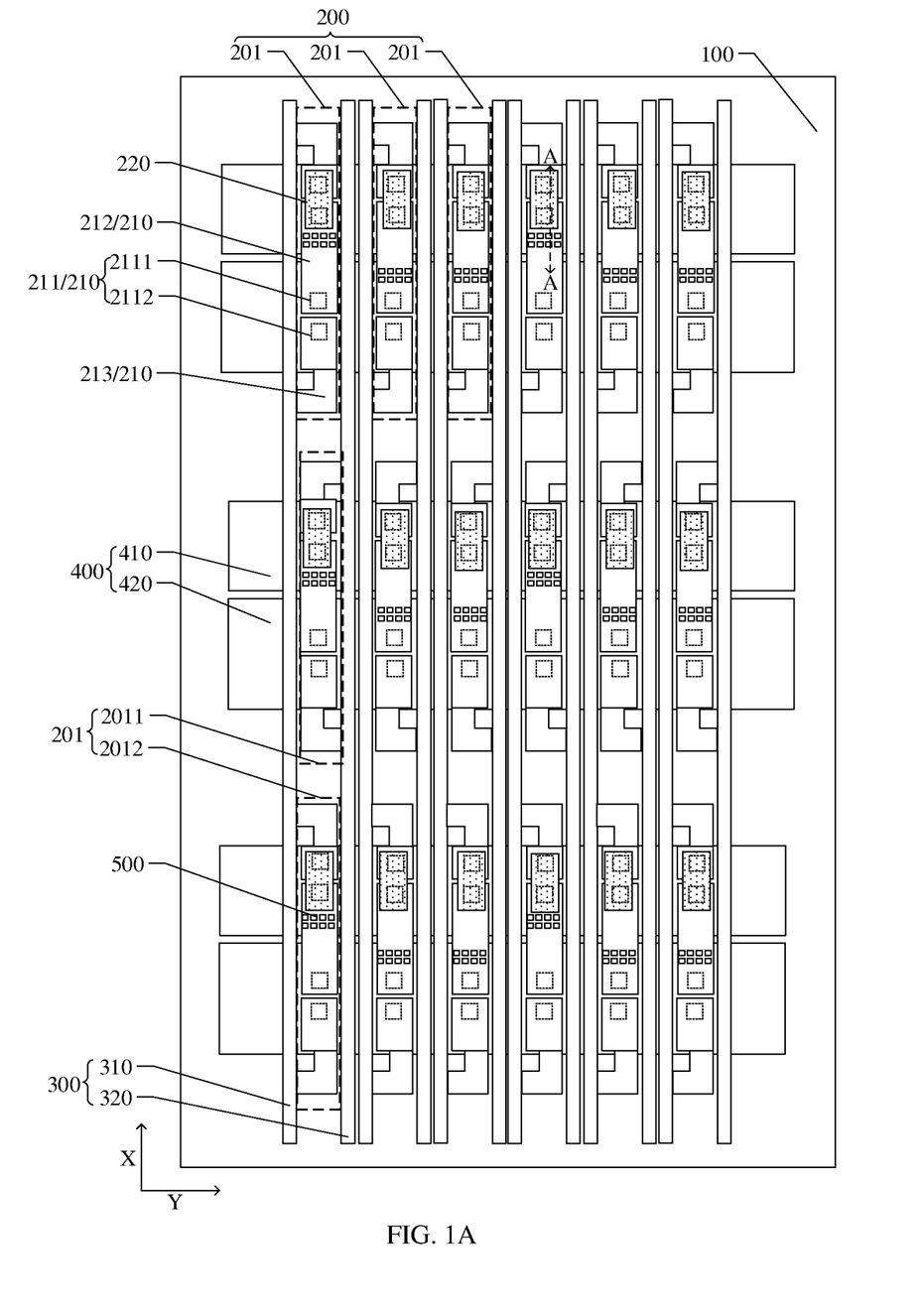
FIG. 1A is a schematic diagram of a partial planar structure of a light emitting plate provided by an embodiment of the present disclosure.
Figure 1B:
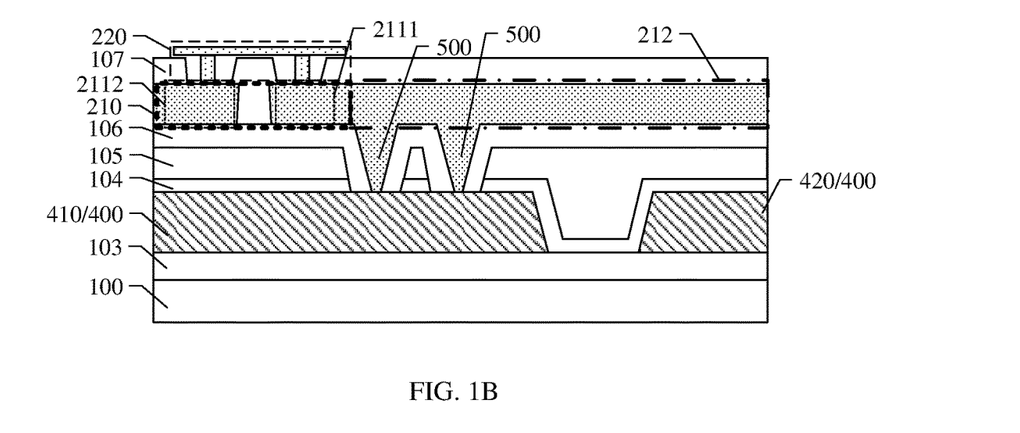
FIG. 1B is a cross-sectional view taken along line AA shown in FIG. 1A.
Figure 2:
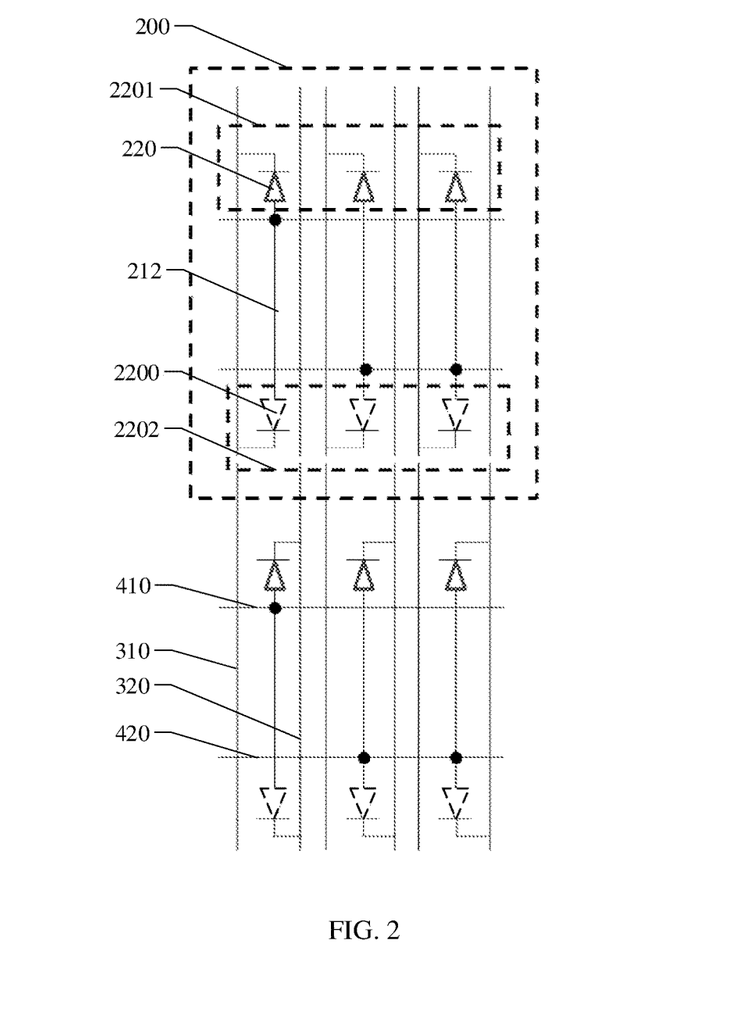
FIG. 2 is a circuit diagram of two light emitting units included in the light emitting plate shown in FIG. 1A.

FIG. 1A is a schematic diagram of a partial planar structure of a light emitting plate provided by an embodiment of the present disclosure, FIG. 1B is a cross-sectional view taken along line AA shown in FIG. 1A, and FIG. 2 is a circuit diagram of two light emitting units included in the light emitting plate shown in FIG. 1A. As shown in FIG. 1A, the light emitting plate in the embodiment of the present disclosure includes a base substrate 100 and a plurality of light emitting units 200 located on the base substrate 100. The plurality of light emitting units 200 are arranged on the base substrate 100 along a first direction and a second direction. FIG. 1A is illustrated by taking that the X direction is the first direction and the Y direction is the second direction as an example, and the first direction is intersected with the second direction. For example, the first direction is perpendicular to the second direction, and the embodiment of the present disclosure includes this case but is not limited thereto. The embodiment of the present disclosure takes that the first direction is a column direction and the second direction is a row direction as an example, where the column direction and the row direction are relative. For example, the first direction and the second direction can also be interchanged, that is, the first direction can also be referred to as the row direction and the second direction can also be referred to as the column direction.

As shown in FIG. 1A and FIG. 1B, each light emitting unit 200 includes at least one light emitting sub-unit 201, the light emitting sub-unit 201 includes a connection line unit 210 and a light emitting diode chip 220 connected with the connection line unit 210, and the light emitting diode chip 220 is located at one side of the connection line unit 210 away from the base substrate 100. Each connection line unit 210 includes at least two electrical contact pairs 211, each electrical contact pair 211 includes a positive electrode contact 2111 and a negative electrode contact 2112; in each connection line unit 210, the positive electrode contacts 2111 are electrically connected with each other, the negative electrode contacts 2112 are electrically connected with each other, and only one electrical contact pair 211 of the at least two electrical contact pairs 211 is connected with the light emitting diode chip. That is, in every connection line unit, all positive electrode contacts are electrically connected, and all negative electrode contacts are electrically connected. The positive electrode contacts 2111 described above are connected with the anode of the light emitting diode chip, and the negative electrode contacts 2111 described above are connected with the cathode of the light emitting diode chip. In the embodiment of the present disclosure, each connection line unit includes at least two electrical contact pairs, one electrical contact pair of the at least two electrical contact pairs is used for connecting the light emitting diode chip, and the other electrical contact pair(s) is/are used as backup electrical contact pair(s). When the light emitting diode chip connected with one electrical contact pair therein is defective, or the electrical contact pair is broken, which causes the light emitting diode chip to fail to emit light, a light emitting diode chip can be connected with any one backup electrical contact pair so as to repair the light emitting sub-unit. The present disclosure is described by taking that the second electrode contact is the positive electrode contact and the first electrode contact is the negative electrode contact point as an example, but is not limited thereto, and they can be interchanged.

For example, as shown in FIG. 1A, the embodiment of the present disclosure is described by taking that each connection line unit 210 includes two electrical contact pairs 211 as an example, one of the two electrical contact pairs 211 is connected with the light emitting diode chip 220, and the other of the two electrical contact pairs 211 serves as a backup electrical contact pair. But the embodiment of that present disclosure is not limited thereto.

For example, the light emitting diode chip in the embodiment of the present disclosure can be a Mini LED. For example, the maximum size of the mini LED in the direction parallel to the base substrate 100 is not more than 500 microns. For example, the size of the mini LED can be 0.1 mm×0.17 mm. The embodiment of the present disclosure is not limited to this case, and the light emitting diode chip can also be a micro LED chip. The size of the light emitting diode chip adopted in the embodiment of the present disclosure is relatively small, for example, the size of each light emitting diode chip accounts for a low proportion (e.g., about 2%) of the pixel region/light emitting region where the light emitting unit is located, so compared with other types of display panels, there is sufficient space for setting the backup electrical contact pair.

For example, the connection line unit can also include three or more electrical contact pairs, and in the case where the connection line unit includes three or more than three electrical contact pairs, one electrical contact pair in the electrical contact pairs is connected with the light emitting diode chip, and the other electrical contact pairs serve as backup electrical contact pairs. For example, the case of the light emitting diode chip being defective can include short circuit or open circuit between the anode and cathode of the light emitting diode chip; and in this case, the connection between the cathode of the defective light emitting diode chip and the negative electrode wire can be cut off, and then, a backup light emitting diode chip can be connected with the backup electrical contact pair, thus repairing the light emitting sub-unit. It should be noted that the backup light emitting diode chip connected with the backup electrical contact pair and the defective light emitting diode chip should be chips emitting light of the same color.

For example, as shown in FIG. 1A, the light emitting plate further includes a plurality of negative electrode wires 300 extending along the first direction (the X direction). The negative electrode wire 300 includes a first negative electrode wire 310 and a second negative electrode wire 320, a column of light emitting sub-units 201 arranged along the first direction includes a first light emitting sub-unit 2011 and a second light emitting sub-unit 2012, the first light emitting sub-unit 2011 is connected with the first negative electrode wire 310 through a corresponding negative electrode contact 2112, and the second light emitting sub-unit 2012 is connected with the second negative electrode wire 320 through a corresponding negative electrode contact 2112, so that one column of light emitting sub-units is connected with two corresponding negative electrode wires.

Compared with the general case of connecting a column of light emitting units (e.g., a column of sub-pixels) with one negative electrode wire, in the embodiment of the present disclosure, one part of the plurality of light emitting units arranged along the first direction are connected with the first wire, and the other part of the plurality of light emitting units arranged along the first direction are connected with the second wire, which can reduce the number of light emitting sub-units connected with each negative electrode wire, that is, reduce the number of light emitting diode chips connected with each negative electrode wire, thereby effectively reducing the current on each negative electrode wire and reducing the power consumption of the negative electrode wire.

For example, in an example of the embodiment of the present disclosure, the light emitting plate can adopt dual-side driving, so the light emitting plate can further include two drivers connected with the negative electrode wires, and the two drivers are respectively located at two edges of the light emitting plate along the first direction. The first negative electrode wires can be connected with one driver, and the second negative electrode wires can be connected with another driver. The first negative electrode wire and the second negative electrode wire connected with a column of light emitting sub-units can be located at the same side of the column of light emitting sub-units, and can also be located at both sides of the column of light emitting sub-units.

For example, taking that the positive direction of the X direction (the direction indicated by the arrow) is upward as an example, the plurality of light emitting sub-units located in a same column can be divided into upper and lower parts, and the number of light emitting sub-units in the two parts can be the same or different. Taking the gap between the two parts of light emitting sub-units as a division line, the first negative wire and the second negative wire can be located at both sides of the division line, so as to be respectively connected with the light emitting sub-units located at both sides of the division line. The embodiment of the present disclosure is not limited to this case, and both the first negative electrode wire and the second negative electrode wire may pass through the division line, as long as the first negative electrode wire and the second negative electrode wire are respectively connected with the light emitting sub-units located at both sides of the division line.

For example, in the case where the first negative electrode wire and the second negative electrode wire are located at both sides of the division line, the first negative electrode wire and the second negative electrode wire which are connected with a column of light emitting sub-units can be located at the same side of the column of light emitting sub-units or can be at both sides of the column of light emitting sub-units, as long as the orthographic projections of the first negative electrode wire and the second negative electrode wire on a straight line extending along the first direction are not overlapped. In this case, each negative electrode wire can be set to have a relatively large line width to reduce power consumption.

For example, in another example of the embodiment of the present disclosure, the light emitting plate can adopt single-side driving, so the light emitting plate can further include one driver connected with the negative electrode wires, and the driver is located at either edge of the light emitting plate along the first direction. The first negative electrode wire and the second negative electrode wire are both connected with the driver. The first negative electrode wire and the second negative electrode wire which are connected with a column of light emitting sub-units can be located at both sides of the column of light emitting sub-units.

In the embodiment shown in FIG. 1A, the first negative electrode wire and the second negative electrode wire are continuous wires. The embodiment shown in FIG. 1A takes that each negative electrode wire has one signal input terminal as an example, but is not limited to this case.

For example, as shown in FIG. 1A, the first negative electrode wire 310 and the second negative electrode wire 320 which are connected with a column of light emitting sub-units 201 arranged in the first direction are located at both sides of the column of light emitting sub-units 201, so that there will be no intersection with other negative electrode wires when the negative electrode contact in the column of light emitting sub-units is connected with a corresponding negative electrode wire, which is convenient for the design of wires. Two negative electrode wires 300 are arranged between two adjacent columns of light emitting sub-units 201 arranged along the second direction, and the distance between the two negative electrode wires 300 is a safety distance to ensure that no short circuit will occur between them. For example, the distance between the two negative electrode wires 300 can be no less than 15 microns. For example, under the condition of ensuring that the distance between two negative electrode wires 300 located between two adjacent columns of light emitting sub-units 201 meets the safety distance, the line width of each negative electrode wire 300 can be set as large as possible, which can ensure the flatness of the negative electrode wire and reduce the resistance of the negative electrode wire.

For example, as shown in FIG. 1A, along the first direction, the first light emitting sub-unit 2011 and the second light emitting sub-unit 2012 can be alternately arranged, which can ensure the uniformity of light emission of the light emitting sub-units. The embodiment of the present disclosure does not limit the arrangements and numbers of the first light emitting sub-units and the second light emitting sub-units, as long as the first light emitting sub-unit is connected with the first negative electrode wire, the second light emitting sub-unit is connected with the second negative electrode wire, and the number of light emitting sub-units connected with each negative electrode wire is reduced.

For example, the number of the first light emitting sub-units 2011 is the same as the number of the second light emitting sub-units 2012, so that the current flowing through each negative electrode wire can be ensured to be approximately equal as far as possible, and the case in which an individual negative electrode wire has a relatively high power consumption can be prevented.

For example, as shown in FIG. 1A, the light emitting plate further includes a plurality of positive electrode wires 400 extending along the second direction (i.e., the Y direction), and the positive electrode wires 400 are located between the negative electrode wires 300 and the base substrate 100. Each connection line unit 210 further includes a positive electrode connecting portion 212, the positive electrode connecting portion 212 is arranged in the same layer as the negative electrode wire 300, and the positive electrode contact 2111 in each connection line unit 210 is connected with the positive electrode wire 400 through the positive electrode connecting portion 212. The present disclosure is described by taking that the first electrode wire is a negative electrode wire and the second electrode wire is a positive electrode wire as an example, but is not limited thereto. They can also be interchanged, that is, the first electrode wire can be the positive electrode wire, and the second electrode wire can be the negative electrode wire.

For example, as shown in FIG. 1A, the positive electrode contact 2111 and the negative electrode contact 2112 can be arranged in the same layer as the negative electrode wire 300 and made of the same material as the negative electrode wire 300. For example, the positive electrode contact 2111, the negative electrode contact 2112 and the negative electrode wire 300 can be formed by performing one patterning process on the same material. For example, the material of the negative electrode wire 300 can include copper.

For example, as shown in FIG. 1A, the positive electrode connecting portion 212 and the negative electrode wire 300 can also be formed by performing one patterning process on the same material.

For example, in the case where a safety distance is kept between the positive electrode connecting portion 212 and either of the negative electrode wires 300 located at both sides of the positive electrode connecting portion 212, the line width of the positive electrode connecting portion 212 can be as large as possible, so as to reduce the resistance of the positive electrode connecting portion 212 and further reduce the power consumption.

For example, as shown in FIG. 1A, the positive electrode contact 2111 and the positive electrode connecting portion 212 can be integrated to facilitate manufacturing.

For example, as shown in FIG. 1A, in the case where the connection line unit 210 includes two electrical contact pairs 211, along the first direction, two positive electrode contacts 2111 are respectively located at both edges of the positive electrode connecting portion 212, and each of two negative electrode contacts 2112 is located at one side of the corresponding positive contact 2111 away from the positive electrode connecting portion 212, and is separated from the corresponding positive contact 2111.

For example, as shown in FIG. 1A, an insulating layer (not shown) is provided between the positive electrode connecting portion 212 and the positive electrode wire 400, and the positive electrode connecting portion 212 can be electrically connected with the positive electrode wire 400 through a via hole 500 penetrating through the insulating layer. For example, each positive electrode connecting portion 212 can be electrically connected with the positive electrode wire 400 through a plurality of via holes 500 to ensure the effect of electrical connection.

For example, as shown in FIG. 1A, in each connection line unit 210, the distance between two positive electrode contacts 2111 is greater than 20 microns, so that a positive electrode connecting portion 212 and a via hole 500 can be provided between the two positive electrode contacts 2111.

For example, as shown in FIG. 1A, along the first direction, the orthographic projection of each positive electrode wire 400 on the base substrate 100 is overlapped with the orthographic projection of one electrical contact pair 211 and the orthographic projection of part of the positive electrode connecting portion 212 on the base substrate 100. In the embodiment of the present disclosure, the line width of the positive electrode wire is set relatively wide, which can reduce the power consumption of the wire.

For example, as shown in FIG. 1A, each connection line unit 210 further includes two negative electrode connecting portion 213 connected with each negative electrode contact 2112, the negative electrode connecting portion 213 is located at one side of the negative electrode contact 2112 away from the positive electrode contact 2111, the negative electrode contact 2112 is connected with the negative electrode wire 300 through the negative electrode connecting portion 213, and the orthographic projection of at least a part of the negative electrode connecting portion 213 on the base substrate 100 is not overlapped with the orthographic projection of the positive electrode wire 400 on the base substrate 100. In the embodiment of the present disclosure, by setting a negative electrode connecting portion that is not overlapped with both the positive electrode wire and the negative electrode wire at least partially, the negative electrode connecting portion can be cut by means of, for example, laser cutting, when the light emitting diode chip is defective, so as to disconnect the connection between the negative electrode contact and the negative electrode wire and to realize repairing the light emitting sub-unit. By setting the negative electrode connecting portion, the influence of the cutting process on the negative electrode wire and the positive electrode wire can be avoided.

For example, as shown in FIG. 1A, the negative electrode connecting portion 213 can be integrated with the negative electrode contact 2112. For example, the negative electrode connecting portion 213 can include a first portion extending along the first direction and a second portion extending along the second direction, the first portion is configured to be connected with the negative electrode wire 300, and the second portion is configured to be connected with the negative electrode contact. The present disclosure is described by taking that the first electrode connecting portion is a negative electrode connecting portion and the second electrode connecting portion is a positive electrode connecting portion as an example, but is not limited to this case. The first electrode connecting portion can also be a positive electrode connecting portion, and the second electrode connecting portion can also be a negative electrode connecting portion.

For example, as shown in FIG. 1A, each light emitting unit 200 can include three light emitting sub-units 201 of different colors arranged along the second direction, the positive electrode wire 400 includes a first positive electrode wire 410 and a second positive electrode wire 420, and one light emitting sub-unit 201 in the light emitting unit 200 is connected with the first positive electrode wire 410, while the other two light emitting sub-units 201 in the light emitting unit 200 are connected with the second positive electrode wire 420. In the embodiment of the present disclosure, by connecting the respective light emitting units with two positive electrode wires, the light emitting sub-units of one color can be independently controlled.

For example, the light emitting unit can include a red light emitting sub-unit, a green light emitting sub-unit, and a blue light emitting sub-unit. The turn-on voltages (referring to the operation voltage when the brightness of the element reaches 1 cd/m²) of the green light emitting unit and the blue light emitting unit are similar, while the turn-on voltage of the red light emitting sub-unit is quite different from those of the green light emitting unit and the blue light emitting unit described above, so the red light emitting sub-unit is connected with the first positive electrode wire separately, while the green light emitting sub-unit and the blue light emitting sub-unit are connected with the second positive electrode wire, thereby ensuring that all light emitting sub-units are applied with corresponding turn-on voltages, which can not only save electric energy, but also prevent overload voltage from being applied to a light emitting sub-unit of a certain color.

For example, as shown in FIG. 1A, both the first positive electrode wire 410 and the second positive electrode wire 420 have a minimum width along the first direction. Taking the first positive electrode wire as an example, and assuming that M light emitting units are arranged along the second direction, the voltage drop value of the first positive electrode wire is IRdrop=$I_t$*R, where $I_t$ is the total current of the M light emitting units arranged along the second direction, R is the resistance of the first positive electrode wire in the light emitting units, and it is satisfied that R=Rs*P/Wr. Rs is the square resistance of the first positive electrode wire, Wr is the width of the first positive electrode wire, and P is the period of the light emitting units along the second direction. Combining the above two formulas, it can be obtained: Wr=($I_t$*Rs*P)/(IRdrop). To ensure the uniformity of display brightness, the voltage drop (IRdrop) of the first positive electrode wire should be less than a certain value K, and in the case where IRdrop=K, Wr has a minimum width Wrm. Similarly, the second positive electrode wire 420 also has a minimum width.

For example, along the first direction, the width of the first positive electrode wire 410 can be less than the width of the second positive electrode wire 420, but not limited to this case. The relationship between the widths of the two positive electrode wires should be determined according to the currents flowing through them.

For example, as shown in FIG. 1B, the base substrate 100 can be a glass substrate. In the embodiment of the present disclosure, a glass substrate provided with connection line units is adopted to replace a commonly used substrate, such as a printed circuit board (PCB) used for electrically connecting the light emitting diode chips in a backlight source or a display panel, so that the problem of poor heat dissipation performance of a common PCB substrate can be solved.

For example, as shown in FIG. 1A and FIG. 1B, the materials of the first negative electrode wire 310, the second negative electrode wire 320 and the positive electrode wire 400 can be conductive materials such as copper. Taking that the materials of the above wires are copper as an example, two copper layers can be deposited on the base substrate by sputtering or can be formed on the base substrate by electroplating. For example, the greater the thicknesses of the first negative electrode wire, the second negative electrode wire and the positive electrode wire, the lower the power consumption, and the better the display effect when the light emitting plate is used as a display panel.

For example, as shown in FIG. 1A and FIG. 1B, a first buffer layer 103 is disposed between the positive electrode wire 400 and the base substrate 100, and the material of the first buffer layer 103 can include silicon nitride. A second buffer layer 104, a planarization layer 105 and a passivation layer 106 are sequentially disposed between the positive electrode wire 400 and the first negative electrode wire 310.

The material of the planarization layer 105 can be resin, and the greater the thickness of the planarization layer 105, the smaller the coupling capacitance between the wire layers located on both sides of the planarization layer 105. The material of the second buffer layer 104 and the passivation layer 106 can be silicon nitride, which is used to avoid the problem of poor adhesion caused by the direct contact between the planarization layer 105 and the metal layers on both sides of the planarization layer 105.

For example, as shown in FIG. 1A and FIG. 1B, the second buffer layer 104, the planarization layer 105 and the passivation layer 106 are provided with via holes 500, so that the positive electrode connecting portion 212 can be electrically connected with the positive electrode wire 400.

For example, as shown in FIG. 1B, an insulating layer 107 is provided at one side of the connection line unit 210 away from the base substrate 100, the insulating layer 107 includes two via holes to expose the positive electrode contact 2111 and the negative electrode contact 2112, respectively; the light emitting diode chip 220 is located at one side of the insulating layer 107 away from the connection line unit 210, and the anode and the cathode included in the light emitting diode chip 220 are electrically connected, through the via holes in the insulating layer 107, with the positive electrode contact 2111 and the negative electrode contact 2112, respectively.

For example, as shown in FIG. 1B, the positive electrode contact 2111 is integrated with the positive electrode connecting portion 212, and the positive electrode connecting portion 212 is connected with the positive electrode wire 400 through a plurality of via holes 500, so that the positive electrode wire 400 is electrically connected with the anodes of the light emitting diode chips 220.

For example, as shown in FIG. 1B, the positive electrode contact 2111 and the negative electrode contact 2112 are arranged in the same layer and spaced apart from each other.

For example, the surfaces of the positive electrode contact 2111 and the negative electrode contact 2112 away from the base substrate 100 can be located in the same plane as the surface of the positive electrode connecting portion 212 away from the base substrate 100, and the embodiment of the present disclosure is not limited thereto. For example, the positive electrode contact 2111 and the negative electrode contact 2112 include two protrusions respectively extending into two via holes of the insulating layer 107, and the anode and the cathode included in the light emitting diode chip 220 are electrically connected with the protrusions of the electrical contact pair through the via holes described above. The above protrusions can be manufactured by the same film forming process as the film layer where the positive electrode connecting portion 212 is located, and can be formed by a halftone mask process in a sequential patterning process.

For example, as shown in FIG. 1A and FIG. 2, each light emitting unit 200 can include two bonding regions (light emitting diode chip connection regions), namely a first bonding region 2201 and a second bonding region 2202. Two electrical contact pairs 211 included in each connection line unit 210 are located in the first bonding region 2201 and the second bonding region 2202, respectively, and the positive electrode connecting portion 212 can be located between the two bonding regions to realize electrical connection with the positive electrode wire 400.

For example, as shown in FIG. 1A and FIG. 2, the plurality of light emitting sub-units 201 in the light emitting unit 200 can all be bonded onto the first bonding region 2201 to realize centralized setting of the light emitting positions of the three light emitting sub-units and uniform display. In the case where the light emitting diode chip of any one light emitting sub-units 201 bonded onto the first bonding region 2201 is defective, a light emitting diode chip of the same color can be bonded to a backup electrical contact pair in the second bonding region 2202, and the backup electrical contact pair and the electrical contact pair connected with the defective light emitting diode chip can be located on a straight line. Of course, the embodiment of the present disclosure is not limited to this case, and the plurality of light emitting sub-units in the light emitting unit can also be bonded onto the second bonding region, and the electrical contact pairs in the first bonding region are all used as backup electrical contact pairs.

For example, the light emitting unit 200 includes three light emitting sub-units 201 arranged along the second direction, the light emitting sub-units 201 located at two sides can be bonded onto a same bonding region, the light emitting sub-unit 201 located in the middle is bonded onto another bonding region, and the connecting lines between the bonding positions of the three light emitting sub-units forms a triangle, which is conducive to realizing the uniformity of light emission.

The light emitting plate shown in FIG. 1A can be a display panel, for example, a passive matrix (PM) display panel, the light emitting unit is a pixel unit, and the light emitting sub-unit included in the light emitting unit is a sub-pixel. The display panel provided by the embodiment of the present disclosure can improve the bonding yield of products by providing backup electrical contact pairs, and can also reduce the power consumption of the negative electrode wire.

Of course, the light emitting plate provided by the embodiment of the present disclosure can also serve as a backlight source to be combined with a liquid crystal display panel, without being limited in the embodiment of the present disclosure.

Figure 3:
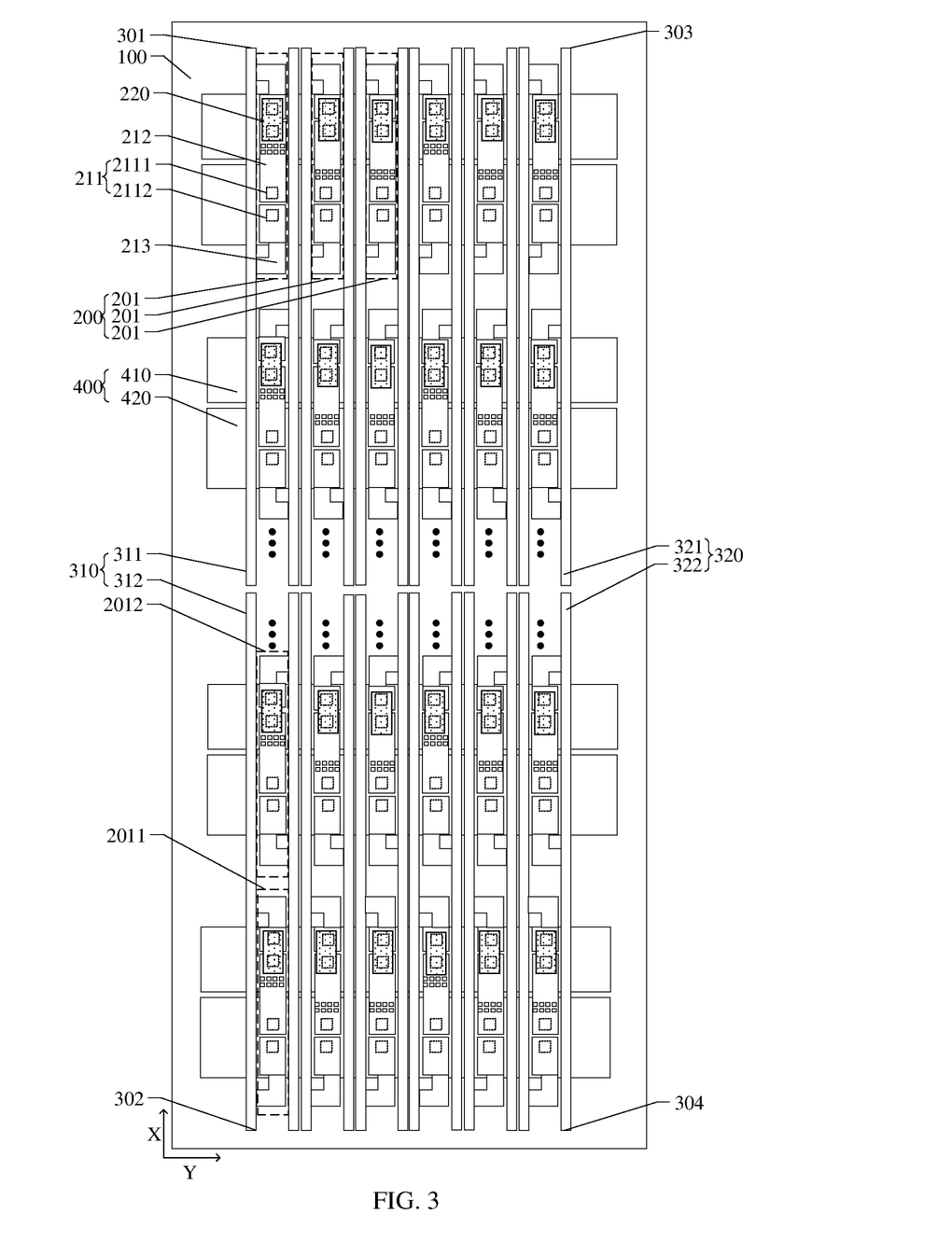
FIG. 3 is a schematic diagram of a partial planar structure of a light emitting plate provided by another embodiment of the present disclosure.

FIG. 3 is a schematic diagram of a partial planar structure of a light emitting plate provided by another embodiment of the present disclosure. As shown in FIG. 3, compared with the embodiment shown in FIG. 1A, the embodiment shown in FIG. 3 is different in that: the first negative electrode wire 310 is not a continuous wire, but is disconnected in the middle to form a first sub-negative electrode wire 311 and a second sub-negative electrode wire 312, and one end of the first sub-negative electrode wire 311 and one end of the second sub-negative electrode wire 312 which are away from each other are two signal input terminals 301 and 302; the second negative electrode wire 320 is not a continuous wire, but is disconnected in the middle to form a third sub-negative electrode wire 321 and a fourth sub-negative electrode wire 322, one end of the third sub-negative electrode wire 321 and one end of the fourth sub-negative electrode wire 322 which are away from each other are configured as two signal input terminals 303 and 304. The present disclosure is described by taking that the first sub-electrode wire is the first sub-negative electrode wire, the second sub-electrode wire is the second sub-negative electrode wire, the third sub-electrode wire is the third sub-negative electrode wire and the fourth sub-negative electrode wire is the fourth sub-negative electrode wire, as an example.

For example, each first negative electrode wire 310 includes a first sub-negative electrode wire 311 and a second sub-negative electrode wire 312 which extend along a same straight line and are insulated from each other, and the spacing between the first sub-negative electrode wire 311 and the second sub-negative electrode wire 312 is not greater than the direct spacing between two adjacent light emitting sub-units; each second negative electrode wire 320 includes a third sub-negative electrode wire 321 and a fourth sub-negative electrode wire 322 which extend along a same straight line and are insulated from each other, and the spacing between the third sub-negative electrode wire 321 and the fourth sub-negative electrode wire 322 is not greater than the direct spacing between two adjacent light emitting sub-units.

As shown in FIG. 3, the light emitting plate provided by the present embodiment can adopt dual-side driving, the first sub-negative electrode wire 311 and the second sub-negative electrode wire 312 included in the first negative electrode wire 310 are respectively connected with two drivers, the third sub-negative electrode wire 321 and the fourth sub-negative electrode wire 322 included in the second negative electrode wire 320 are respectively connected with the above two drivers, and the two drivers can be respectively located at two edges of the light emitting plate at two sides opposed in the first direction.

For example, as shown in FIG. 3, the signal input terminal 301 of the first sub-negative electrode wire 311 and the signal input terminal 303 of the third sub-negative electrode wire 321 can be connected with a same driver, and the signal input terminal 302 of the second sub-negative electrode wire 312 and the signal input terminal 304 of the fourth sub-negative electrode wire 322 can be connected with a same driver.

For example, as shown in FIG. 3, the first sub-negative electrode wire 311 and the second sub-negative electrode wire 312 can be located on a same straight line, and the third sub-negative electrode wire 321 and the fourth sub-negative electrode wire 322 can be located on a same straight line.

For example, as shown in FIG. 3, part of the first light emitting sub-units 2011 close to the first sub-negative electrode wire 311 are connected with the first sub-negative electrode wire 311, and part of the first light emitting sub-units 2011 close to the second sub-negative electrode wire 312 are connected with the second sub-negative electrode wire 312. Part of the second light emitting sub-units 2012 close to the third sub-negative electrode wire 321 are connected with the third sub-negative electrode wire 321, and part of the second light emitting sub-units 2012 close to the fourth sub-negative electrode wire 322 are connected with the fourth sub-negative electrode wire 322.

For example, the plurality of light emitting sub-units in a same column can be divided into two parts along the first direction, and the number of light emitting sub-units in the two parts can be the same or different. Taking the gap between the two parts of light emitting sub-units as a division line, the first sub-negative electrode wire and the second sub-negative electrode wire are located at both sides of the division line to be respectively connected with the light emitting sub-units located at both sides of the division line, and the third sub-negative electrode wire and the fourth sub-negative electrode wire are located at both sides of the division line to be respectively connected with the light emitting sub-units located at both sides of the division line.

Compared with the general case of connecting a column of light emitting sub-units (e.g., a column of sub-pixels) with one negative electrode wire, in the embodiment of the present disclosure, a column of light emitting sub-units arranged along the first direction includes four parts of light emitting sub-units, the first part of light emitting sub-units are connected with the first sub-negative electrode wire, the second part of light emitting sub-units are connected with the second sub-negative electrode wire, the third part of light emitting sub-units are connected with the third sub-negative electrode wire, and the fourth part of light emitting sub-units are connected with the fourth sub-negative electrode wire. That is, a column of light emitting sub-units are connected with four negative electrode wires, which can further reduce the number of light emitting sub-units connected with each negative electrode wire, that is, reduce the number of light emitting diode chips connected with each negative electrode wire, thereby effectively reducing the current on each negative electrode wire and reducing the power consumption of the negative electrode wire.

In the embodiments of the present disclosure, the characteristics of the positive electrode wire, the number and arrangement of the light emitting sub-units included in the light emitting unit, and the characteristics of the connection line units included in the light emitting sub-units, are the same as those in the embodiment shown in FIG. 1A and FIG. 2, and d.

The light emitting plate shown in FIG. 3 can be a display panel, the light emitting unit is a pixel unit, and the light emitting sub-unit included in the light emitting unit is a sub-pixel. The display panel provided by the embodiment of the present disclosure can improve the bonding yield of products by providing backup electrical contact pairs, and can also reduce the power consumption of the negative electrode wire.

Of course, the light emitting plate provided by the embodiment of the present disclosure can also serve as a backlight source to be combined with a liquid crystal display panel, without being limited in the embodiment of the present disclosure.

Another embodiment of the present disclosure provides a display device which includes any one of the display panels described above. The display device provided by the embodiment of the present disclosure can improve the bonding yield of products by providing backup electrical contact pairs, and can also reduce the power consumption of the negative electrode wire.

Figure 4:
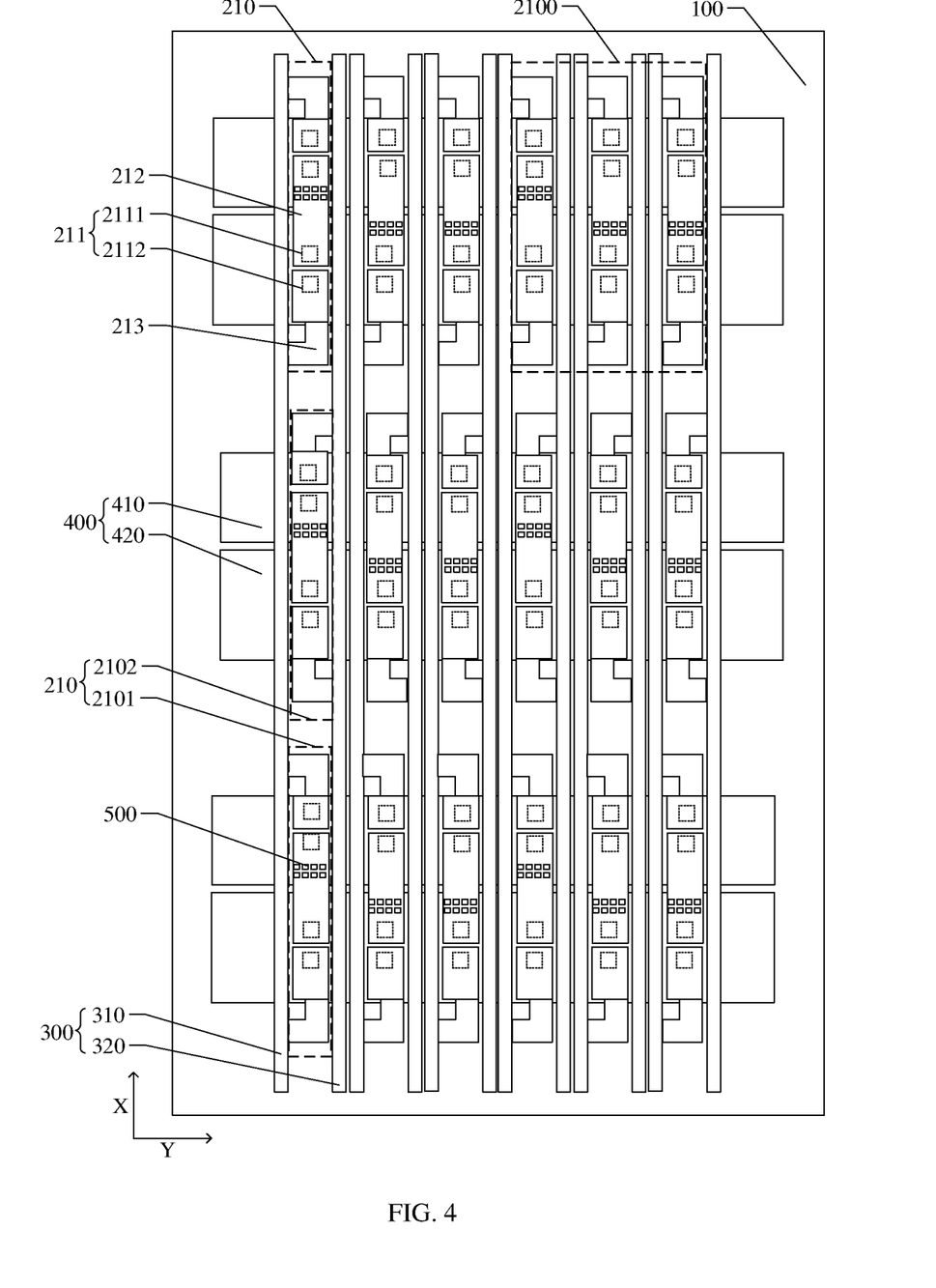
FIG. 4 is a schematic diagram of a partial planar structure of a wiring plate provided by an embodiment of the present disclosure.

FIG. 4 is a schematic diagram of a partial planar structure of a wiring plate provided by an embodiment of the present disclosure. As shown in FIG. 4, the wiring plate includes a base substrate 100 and a plurality of connection line units 210 located on the base substrate 100. The plurality of connection line units 210 are arranged on the base substrate 100 along a first direction and a second direction, and FIG. 4 is illustrated by taking that the X direction is the first direction and the Y direction is the second direction as an example.

As shown in FIG. 4, each connection line unit 210 includes at least two electrical contact pairs 211, each electrical contact pair 211 includes a positive electrode contact 2111 and a negative electrode contact 2112; in each connection line unit 210, the positive electrode contacts 2111 are electrically connected with each other, and the negative electrode contacts 2112 are electrically connected with each other. The positive electrode contact 2111 and the negative electrode contact 2112 of only one electrical contact pair in the at least two electrical contact pairs 211 are configured to be connected with the anode and the cathode of one light emitting diode chip, respectively. In the embodiment of the present disclosure, each connection line unit includes at least two electrical contact pairs, one electrical contact pair of the at least two electrical contact pairs is used for connecting the light emitting diode chip, and the other electrical contact pairs are used as backup electrical contact pairs. When the light emitting diode chip connected with one electrical contact pair therein is defective, a light emitting diode chip can be connected with any one backup electrical contact pair so as to repair the light emitting sub-unit.

For example, as shown in FIG. 4, the embodiment of the present disclosure is described by taking that each connection line unit 210 includes two electrical contact pairs 211 as an example, one of the two electrical contact pairs 211 is configured to be connected with the light emitting diode chip 220, and the other of the two electrical contact pairs 211 serves as a backup electrical contact pair. But the embodiment of that present disclosure is not limited thereto, and the connection line unit can also include three or more electrical contact pairs. In the case where the connection line unit includes more than three electrical contact pairs, one electrical contact pair in the electrical contact pairs is connected with the light emitting diode chip, and the other electrical contact pairs serve as backup electrical contact pairs.

For example, as shown in FIG. 4, the wiring plate further includes a plurality of negative electrode wires 300 extending along the first direction (the X direction). The negative electrode wire 300 includes a first negative electrode wire 310 and a second negative electrode wire 320. A column of connection line units 210 arranged along the first direction includes a plurality of first connection line units 2101 and a plurality of second connection line units 2102, the negative electrode contact 2112 of the first connection line unit 2101 is connected with the first negative electrode wire 310, and the negative electrode contact 2112 of the second connection line unit 2102 is connected with the second negative electrode wire 320. For example, taking that a column of connection line units arranged along the first direction is a column of connection line units as an example, a column of connection line units are connected with two corresponding negative electrode wires.

Compared with the general case of connecting a column of connection line units (for example, a column of connection line units is configured to be connected with a column of sub-pixels) with one negative electrode wire, in the embodiment of the present disclosure, the connection line units arranged along the first direction are connected with two negative electrode wires, which can reduce the number of connection line units connected with each negative electrode wire, that is, reduce the number of light emitting diode chips connected with each negative electrode wire, thereby effectively reducing the current on each negative electrode wire and reducing the power consumption of the negative electrode wire.

For example, as shown in FIG. 4, the first negative electrode wire 310 and the second negative electrode wire 320 which are connected with a column of connection line units 210 arranged in the first direction are located at both sides of the column of connection line units 210, so that there will be no intersection with other negative electrode wires when the negative electrode contact in the column of light emitting sub-units is connected with a corresponding negative electrode wire, which is convenient for the design of wires. Taking that a column of light emitting sub-units arranged along the first direction is a column of light emitting sub-units as an example, two negative electrode wires 300 are arranged between two adjacent columns of connection line units 210 arranged along the second direction, and the distance between the two negative electrode wires 300 is a safety distance to ensure that no short circuit will occur between them. For example, the distance between the two negative electrode wires 300 can be no less than 15 microns. For example, under the condition of ensuring that the distance between two negative electrode wires 300 located between two adjacent columns of connection line units 210 meets the safety distance, the line width of each negative electrode wire 300 can be set as large as possible (for example, it can be 30 microns), and the resistance of the negative electrode wire can also be reduced.

For example, as shown in FIG. 4, along the first direction, the first connection line unit 2101 and the second connection line unit 2102 can be alternately arranged. The embodiment of the present disclosure is not limited to this case, as long as the first connection line unit is connected with the first negative electrode wire, the second connection line unit is connected with the second negative electrode wire, and the number of connection line units connected with each negative electrode wire is reduced.

For example, the number of the first connection line units 2101 is the same as the number of the second connection line units 2102.

For example, as shown in FIG. 4, the wiring plate further includes a plurality of positive electrode wires 400 extending along the second direction (i.e., the Y direction), and the positive electrode wires 400 are located between the negative electrode wires 300 and the base substrate 100. Each connection line unit 210 further includes a positive electrode connecting portion 212, the positive electrode connecting portion 212 is arranged in the same layer as the negative electrode wire 300, and the positive electrode contact 2111 in each connection line unit 210 is connected with the positive electrode wire 400 through the positive electrode connecting portion 212.

For example, as shown in FIG. 4, the positive electrode contact 2111 and the positive electrode connecting portion 212 can be integrated to facilitate manufacturing.

For example, as shown in FIG. 4, in the case where the connection line unit 210 includes two electrical contact pairs 211, along the first direction, two positive electrode contacts 2111 are respectively located at both edges of the positive electrode connecting portion 212, and each of two negative electrode contacts 2112 is located at one side of the corresponding positive contact 2111 away from the positive electrode connecting portion 212, and is separated from the corresponding positive contact 2111.

For example, as shown in FIG. 4, an insulating layer (not shown) is provided between the positive electrode connecting portion 212 and the positive electrode wire 400, and the positive electrode connecting portion 212 can be electrically connected with the positive electrode wire 400 through a plurality of via holes 500 penetrating through the insulating layer.

For example, as shown in FIG. 4, along the first direction, the orthographic projection of each positive electrode wire 400 on the base substrate 100 is overlapped with the orthographic projection of one electrical contact pair 211 and the orthographic projection of part of the positive electrode connecting portion 212 on the base substrate 100. In the embodiment of the present disclosure, the line width of the positive electrode wire is set relatively wide, which can reduce the power consumption of the wire.

For example, as shown in FIG. 4, each connection line unit 210 further includes two negative electrode connecting portion 213 connected with each negative electrode contact 2112, the negative electrode connecting portion 213 is located at one side of the negative electrode contact 2112 away from the positive electrode contact 2111, the negative electrode contact 2112 is connected with the negative electrode wire 300 through the negative electrode connecting portion 213, and the orthographic projection of at least a part of the negative electrode connecting portion 213 on the base substrate 100 is not overlapped with the orthographic projection of the positive electrode wire 400 on the base substrate 100. In the embodiment of the present disclosure, by setting a negative electrode connecting portion that is not overlapped with both the positive electrode wire and the negative electrode wire at least partially, the negative electrode connecting portion can be cut by means of, for example, laser cutting, when the light emitting diode chip is defective, so as to disconnect the connection between the negative electrode contact and the negative electrode wire and to realize repairing the light emitting sub-unit. By setting the negative electrode connecting portion, the influence of the cutting process on the negative electrode wire and the positive electrode wire can be avoided.

For example, as shown in FIG. 4, three adjacent connection line units 210 arranged along the second direction form a connection line unit group 2100, the positive electrode wire 400 includes a first positive electrode wire 410 and a second positive electrode wire 420, and one connection line unit 210 in the connection line unit group 2100 is connected with the first positive electrode wire 410, and the other two connection line units 210 in the connection line unit group 2100 are connected with the second positive electrode wire 420. And along the first direction, the width of the first positive electrode wire is less than the width of the second positive electrode wire. In the embodiment of the present disclosure, by connecting each connection line unit group with two positive electrode wires, one connection line unit can be independently controlled.

For example, the three connection line units are respectively connected with a red light emitting diode chip, a green light emitting diode chip and a blue light emitting diode chip. For example, the connection line unit connected with the red light emitting diode chip can be connected with the first positive electrode wire, and the connection line unit connected with the green light emitting diode chip and the connection line unit connected with the blue light emitting diode chip can be connected with the second positive electrode wire, so as to ensure that each light emitting sub-unit is applied with a corresponding turn-on voltage, which can not only save electric energy, but also prevent overload voltage from being applied to a light emitting sub-unit of a certain color.

The wiring plate shown in FIG. 4 is the structure of the light emitting plate shown in FIG. 1A without the light emitting diode chip, and the specific characteristics of the wiring plate are the same as those of the wiring plate shown in FIG. 1A. Therefore, in the embodiment shown in FIG. 4, the characteristics of the wiring plate can be referred to the corresponding embodiment shown in FIG. 1A. The wiring plate can be applied to a display panel, and can also applied to a backlight source. The wiring plate provided by the embodiment of the present disclosure can not only improve the bonding yield of products by providing backup electrical contact pairs, but also reduce the power consumption of the negative electrode wire.

Figure 5:
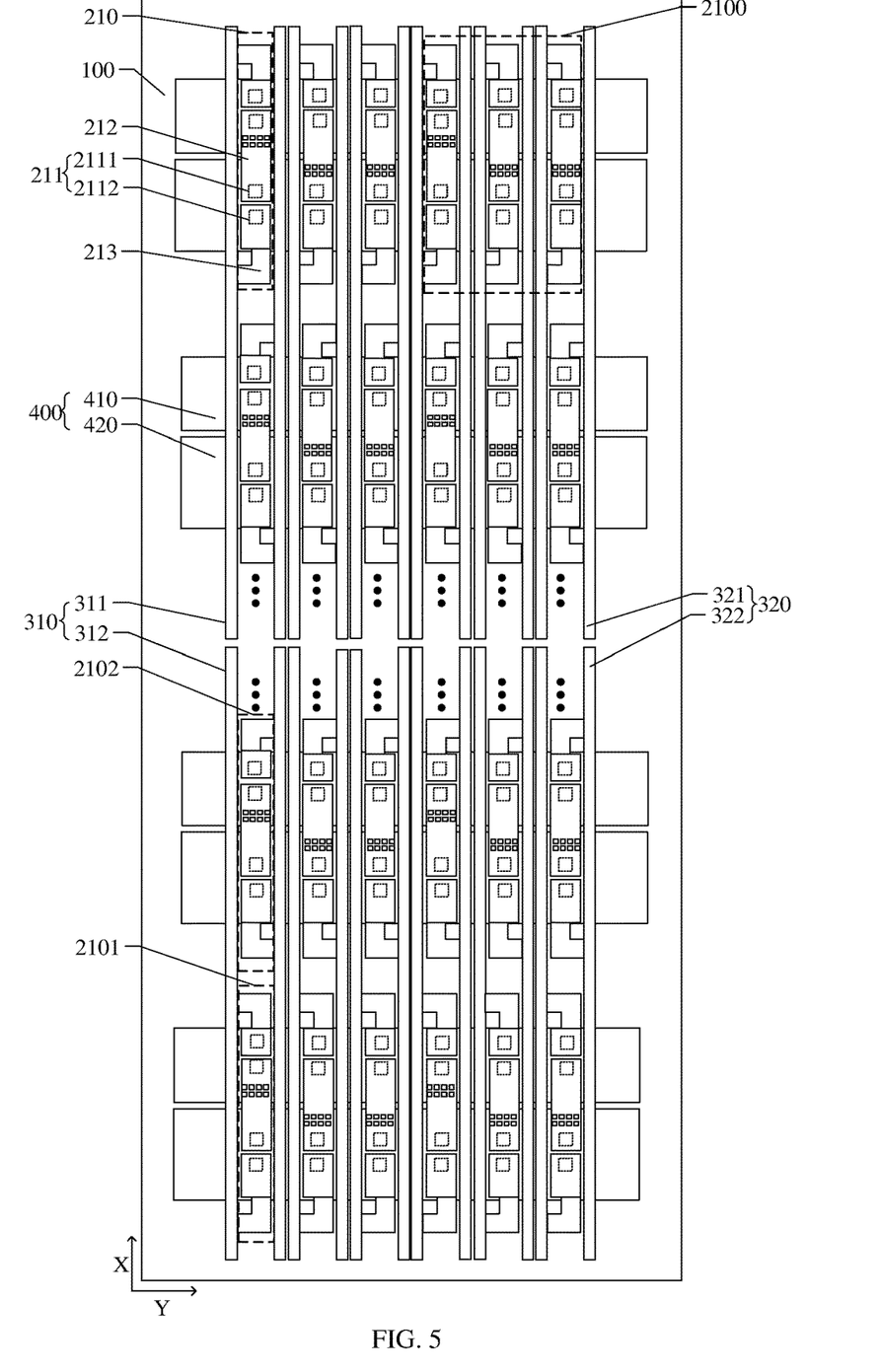
FIG. 5 is a schematic diagram of a partial planar structure of a wiring plate provided by another embodiment of the present disclosure.

FIG. 5 is a schematic diagram of a partial planar structure of a wiring plate provided by another embodiment of the present disclosure. As shown in FIG. 5, compared with the embodiment shown in FIG. 4, the embodiment shown in FIG. 5 is different in that: the first negative electrode wire 310 is not a continuous wire, but is disconnected in the middle to form a first sub-negative electrode wire 311 and a second sub-negative electrode wire 312, and the second negative electrode wire 320 is not a continuous wire, but is disconnected in the middle to form a third sub-negative electrode wire 321 and a fourth sub-negative electrode wire 322.

As shown in FIG. 5, the wiring plate provided by the present embodiment can adopt dual-side driving, the first sub-negative electrode wire 311 and the second sub-negative electrode wire 312 included in the first negative electrode wire 310 are respectively connected with two drivers, the third sub-negative electrode wire 321 and the fourth sub-negative electrode wire 322 included in the second negative electrode wire 320 are respectively connected with the above two drivers, and the two drivers can be respectively located at two edges of the wiring plate at two sides opposed in the first direction.

For example, as shown in FIG. 5, the first sub-negative electrode wire 311 and the second sub-negative electrode wire 312 can be located on a same straight line, and the third sub-negative electrode wire 321 and the fourth sub-negative electrode wire 322 can be located on a same straight line.

For example, as shown in FIG. 5, part of the first connection line units 2101 close to the first sub-negative electrode wire 311 are connected with the first sub-negative electrode wire 311, and part of the first connection line units 2101 close to the second sub-negative electrode wire 312 are connected with the second sub-negative electrode wire 312. Part of the second connection line units 2102 close to the third sub-negative electrode wire 321 are connected with the third sub-negative electrode wire 321, and part of the second connection line units 2102 close to the fourth sub-negative electrode wire 322 are connected with the fourth sub-negative electrode wire 322.

For example, the plurality of connection line units in a same column can be divided into two parts along the first direction, and the number of connection line units in the two parts can be the same or different. Taking the gap between the two parts of connection line units as a division line, the first sub-negative electrode wire and the second sub-negative electrode wire are located at both sides of the division line to be respectively connected with the connection line units located at both sides of the division line, and the third sub-negative electrode wire and the fourth sub-negative electrode wire are located at both sides of the division line to be respectively connected with the connection line units located at both sides of the division line.

Compared with the general case of connecting a column of connection line units (for example, a column of connection line units is configured to be connected with a column of sub-pixels) with one negative electrode wire, in the embodiment of the present disclosure, a column of connection line units is configured to be connected with four negative electrode wires, which can reduce the number of connection line units connected with each negative electrode wire, that is, reduce the number of light emitting diode chips connected with each negative electrode wire, thereby effectively reducing the current on each negative electrode wire and reducing the power consumption of the negative electrode wire.

The characteristics of the positive electrode wire, the number and arrangement of the connection line units in the embodiment of the present disclosure are the same as those in the embodiment shown in FIG. 4, and details will not be repeated here.

The wiring plate shown in FIG. 5 is the structure of the light emitting plate shown in FIG. 3 without the light emitting diode chip, and the specific characteristics of the wiring plate are the same as those of the wiring plate shown in FIG. 3. Therefore, in the embodiment shown in FIG. 5, the characteristics of the wiring plate can be referred to the corresponding embodiment shown in FIG. 3. The wiring plate can be applied to a display panel, and can also applied to a backlight source. The wiring plate provided by the embodiment of the present disclosure can not only improve the bonding yield of products by providing backup electrical contact pairs, but also reduce the power consumption of the negative electrode wire.

The following points should be noted:

(1) Only the structures relevant to the embodiments of the present disclosure are involved in the accompanying drawings of the embodiments of the present disclosure, and other structures may refer to the conventional design.

(2) The features in the same or different embodiments of the disclosure may be mutually combined without conflict.

The foregoing are merely exemplary embodiments of the invention, but is not used to limit the protection scope of the disclosure. The protection scope of the disclosure shall be defined by the attached claims.

What is claimed is:

1. A light emitting plate, comprising:
a base substrate; and
a plurality of light emitting units, arranged on the base substrate along a first direction and a second direction, each of the plurality of light emitting units comprising at least one light emitting sub-unit, the light emitting sub-unit comprising a connection line unit and a light emitting diode chip connected with the connection line unit, the light emitting diode chip being located at a side of the connection line unit away from the base substrate;
wherein each connection line unit comprises at least two electrical contact pairs, and each of the at least two electrical contact pairs comprises a first electrode contact and a second electrode contact; in each connection line unit, the first electrode contacts are electrically connected with each other, the second electrode contacts are electrically connected with each other, and only one electrical contact pair of the at least two electrical contact pairs is connected with the light emitting diode chip.

2. The light emitting plate according to claim 1, further comprising:
a plurality of first electrode wires extending along the first direction,
wherein the plurality of first electrode wires comprises a plurality of first-type first electrode wires and a plurality of second-type first electrode wires, a column of light emitting sub-units arranged along the first direction comprises a plurality of first light emitting sub-units and a plurality of second light emitting sub-units, the plurality of first light emitting sub-units are connected with the first-type first electrode wire through the first electrode contacts, and the plurality of second light emitting sub-units are connected with the second-type first electrode wire through the first electrode contacts.

3. The light emitting plate according to claim 2, wherein the first-type first electrode wire and the second-type first electrode wire that are connected with a column of light emitting sub-units arranged along the first direction are located at both sides of the column of light emitting sub-units, respectively.

4. The light emitting plate according to claim 2, wherein each of the plurality of first-type first electrode wires comprises a first sub-electrode wire and a second sub-electrode wire which extend along a same straight line and are insulated from each other, a part of the plurality of first light emitting sub-units close to the first sub-electrode wire are connected with the first sub-electrode wire, and a part of the plurality of first light emitting sub-units close to the second sub-electrode wire are connected with the second sub-electrode wire;

each of the plurality of second-type first electrode wires comprises a third sub-electrode wire and a fourth sub-electrode wire which extend along a same straight line and are insulated from each other, a part of the plurality of second light emitting sub-units close to the third sub-electrode wire are connected with the third sub-electrode wire, and a part of the plurality of second light emitting sub-units close to the fourth sub-electrode wire are connected with the fourth sub-electrode wire.

5. The light emitting plate according to claim 2, further comprising:
a plurality of second electrode wires, extending along the second direction, the plurality of second electrode wires being located between the plurality of first electrode wires and the base substrate,
wherein each connection line unit further comprises a second electrode connecting portion, the second electrode connecting portion is arranged in a same layer as the first electrode wire, and the second electrode contact in each connection line unit is connected with the second electrode wire through the second electrode connecting portion.

6. The light emitting plate according to claim 5, wherein the second electrode contact is integrated with the second electrode connecting portion.

7. The light emitting plate according to claim 5, wherein, in the first direction, an orthographic projection of each second electrode wire on the base substrate is overlapped with an orthographic projection of one of the electrical contact pairs and a part of the second electrode connecting portion on the base substrate.

8. The light emitting plate according to claim 5, wherein each of the plurality of light emitting units comprises three light emitting sub-units of different colors arranged along the second direction, the second electrode wire comprises a first-type second electrode wire and a second-type second electrode wire, and one of the three light emitting sub-units in the each of the plurality of light emitting units is connected with the first-type second electrode wire, and the other two of the three light emitting sub-units in the each of the plurality of light emitting units are connected with the second-type second electrode wire.

9. The light emitting plate according to claim 5, wherein each connection line unit comprises two electrical contact pairs, and each connection line unit further comprises two first electrode connecting portions connected with the first electrode contacts, the first electrode connecting portion is located at a side of the first electrode contact away from the second electrode contact, the first electrode contact is connected with the first electrode wire through the first electrode connecting portion, and an orthographic projection of at least part of the first electrode connecting portion on the base substrate is not overlapped with an orthographic projection of the second electrode wire on the base substrate.

10. A display device, comprising the light emitting plate according to claim 1, wherein the light emitting plate is a display panel.

11. A wiring plate, comprising:
a base substrate;
a plurality of connection line units, arranged on the base substrate along a first direction and a second direction,
wherein each of the plurality of connection line units comprises at least two electrical contact pairs, and each of the at least two electrical contact pairs comprises a first electrode contact and a second electrode contact; in each connection line unit, the first electrode contacts are electrically connected with each other, and the second electrode contacts are electrically connected with each other.

12. The wiring plate according to claim 11, further comprising:
a plurality of first electrode wires extending along the first direction,
wherein the plurality of first electrode wires comprises a plurality of first-type first electrode wires and a plurality of second-type first electrode wires, a column of connection line units arranged along the first direction comprises a plurality of first connection line units and a plurality of second connection line units, the first electrode contacts of the plurality of first connection line units are connected with the plurality of first-type first electrode wires, and the first electrode contacts of the plurality of second connection line units are connected with the plurality of second-type first electrode wires.

13. The wiring plate according to claim 12, wherein the first-type first electrode wire and the second-type first electrode wire that are connected with a column of connection line units arranged along the first direction are located at both sides of the column of the connection line units, respectively.

14. The wiring plate according to claim 13, wherein each of the plurality of first-type first electrode wires comprises a first sub-electrode wire and a second sub-electrode wire which extend along a same straight line and are insulated from each other, a part of the plurality of first connection line units close to the first sub-electrode wire are connected with the first sub-electrode wire, and a part of the plurality of first connection line units close to the second sub-electrode wire are connected with the second sub-electrode wire;

each of the plurality of second-type first electrode wires comprises a third sub-electrode wire and a fourth sub-electrode wire which extend along a same straight line and are insulated from each other, a part of the plurality of second connection line units close to the third sub-electrode wire are connected with the third sub-electrode wire, and a part of the plurality of second connection line units close to the fourth sub-electrode wire are connected with the fourth sub-electrode wire.

15. The wiring plate according to claim 12, further comprising:
a plurality of second electrode wires, extending along the second direction, the plurality of second electrode wires being located at a side of the plurality of first electrode wires facing the base substrate,
wherein each connection line unit further comprises a second electrode connecting portion, the second electrode connecting portion is arranged in a same layer as the first electrode wire, and the second electrode contact in each connection line unit is connected with the second electrode wire through the second electrode connecting portion.

16. The wiring plate according to claim 15, wherein, in the first direction, an orthographic projection of each second electrode wire on the base substrate is overlapped with an orthographic projection of one of the electrical contact pairs and a part of the second electrode connecting portion on the base substrate.

17. The wiring plate according to claim 15, wherein three adjacent connection line units arranged along the second direction form a connection line unit group, the second electrode wire comprises a first-type second electrode wire and a second-type second electrode wire, one of the three connection line units in the connection line unit group is connected with the first-type second electrode wire, and the other two of the three connection line units in the connection line unit group are connected with the second-type second electrode wire.

18. The wiring plate according to claim 15, wherein each of the plurality of connection line units comprises two electrical contact pairs, and each connection line unit further comprises two first electrode connecting portions connected with the first electrode contacts, the first electrode connecting portion is located at a side of the first electrode contact away from the second electrode contact, the first electrode contact is connected with the first electrode wire through the first electrode connecting portion, and an orthographic projection of at least part of the first electrode connecting portion on the base substrate is not overlapped with an orthographic projection of the second electrode wire on the base substrate.

* * * * *